United States Patent [19]

DePaul

[11] Patent Number: 4,651,416

[45] Date of Patent: Mar. 24, 1987

[54] PRINTED CIRCUITS

[76] Inventor: Albert D. DePaul, 413 W. 52nd St., New York, N.Y. 10019

[21] Appl. No.: 769,327

[22] Filed: Aug. 26, 1985

Related U.S. Application Data

[63] Continuation-in-part of Ser. No. 547,082, Oct. 31, 1983, abandoned.

[51] Int. Cl.<sup>4</sup> ........................... H05K 3/30; H01R 9/00
[52] U.S. Cl. ..................................... 29/837; 361/405; 174/68.5; 339/17 CF
[58] Field of Search .......................... 29/836, 837, 839; 179/68.5; 361/400, 404, 405, 406; 339/17 CF

[56] References Cited

U.S. PATENT DOCUMENTS 3,061,760 10/1962 Ezzo ............................. 339/17 C X
3,506,879 4/1970 Maxwell et al. .................... 361/406
3,753,046 8/1973 Towell ............................ 361/400 X

FOREIGN PATENT DOCUMENTS 1259427 1/1968 Fed. Rep. of Germany ...... 361/405

Primary Examiner—Howard N. Goldberg
Assistant Examiner—Carl J. Arbes

[57] ABSTRACT

The invention features a method of modifying a printed circuit board so that it can obtain a doubling of its integrated circuit capacity or memory storage. Identical integrated circuit chips are disposed in the same set of pin holes except for a select lead. The printed circuit is slightly modified to enable both chips to function independently. Thus, the density of the circuit board is increased, while using essentially the same circuitry and connections.

8 Claims, 4 Drawing Figures

PRINTED CIRCUITS

RELATED APPLICATION

This application is a continuation-in-part of the parent application, Ser. No. 547,082, filed Oct. 31, 1983, now abandoned.

FIELD OF THE INVENTION

This invention relates to printed circuit boards utilizing integrated circuit chips, and more particuarly to printed circuit boards having increased integrated circuit density.

BACKGROUND OF THE INVENTION

In the past, redundancy has been incorporated in some printed circuits by double ganging integrated circuit chips one upon the other, in piggy-back fashion. Such a doubling of the integrated circuit chips did not increase the memory or circuit capacity, since the chips shared the exact pin connections, including the select lead. Such doubling was for the purpose of providing increased reliability by insuring that there was a back-up chip in the event of failure.

The present invention features a doubling of integrated circuit chips upon a printed circuit board, wherein there is a true doubling of the circuit capacity or memory capacity of the printed board.

The invention utilizes the underside of the circuit board to mount additional integrated circuits to the board in essentially the same pin-hole sequences as that of the integrated circuits disposed on the top-side of the printed circuit board. The printed circuit board is modified to provide additional select leads, so that each additional chip acts independently of its coaligned host. In effect, the invention provides double circuitry from only one printed circuit. The economics and advantages obtained by such increased capacity are self-evident.

In order to achieve underside mounting of additional integrated circuit chips in the same pin-hole sequence as the top-side chips, the underside chips require a complete 180 degree reversal of their pins. This is accomplished by bending the existing pins in a diametrically opposite direction. The select pin of the underside chip is also further modified or bent to fit the new select pin-hole connection of the modified printed circuit.

DISCUSSION OF THE RELATED ART

As aforementioned, it has been known to build redundancy into printed circuits by piggy-backing the chips one-upon another. Naturally, the pin-hole sequences for each integrated circuit chip that is double ganged is identical, and there is no need to modify either the pins of the chip or the printing of the circuit to accomplish this objective. The purpose of this circuit chip doubling is not for the same purposes as set forth for this invention.

In the IBM Technical Disclosure Bulletin, Vol. 1, No. 4, December 1958, it is suggested that the pins of the integrated circuit chips can be temporarily bent upwardly. The pins then can be backbent to form a crimp in the pins. This crimp provides a mechanical strengthening of the pins.

It is also taught in this bulletin that the pins may be bent inwardly to anchor or affix them to the board.

In U.S. Pat. No. 3,882,807, issued May 13, 1975, a procedure is described that bends the pins of chips downwardly in order to separate the chips fabricated upon a continuous strip. This method refers to bending the leads in the fabrication of individual chips, and not in the making of a circuit board.

In the U.S. Pat. No. 4,399,610, issued Aug. 23, 1983, the leads of an integrated circuit chip are illustrated in an L-configuration in order to provide simultaneous contact of all the leads when placed upon a planar surface. There is no teaching that the bending of leads in this fashion can be for purposes of doubling the integrated circuit capacity.

BRIEF SUMMARY OF THE INVENTION

The invention pertains to a method and article of manufacture wherein printed circuit boards can be modified to provide increased integrated circuit density. The printed circuit board is fabricated having at least one set of pin holes that can accommodate two integrated circuit chips. Each hole of the set, except for a first select lead, receives a set of pins in the same sequence from both a first and a second integrated circuit chip. The chips are disposed on opposite sides of the circuit board.

A second select lead connection is provided to distinguish between the first and second integrated circuit chips. The first integrated circuit chip is connected to the pin hole set including the first select lead connection, while the second chip is connected to the pin hole set minus the first select lead connection, but including the second select lead connection.

The pins of the first and second chip are disposed in opposite directions so that the second chip can be inserted from the underside of the board, in essentially the same pin-hole sequence.

It is an object of the invention to provide an improved method and article of manufacture for a printed circuit board.

It is another object of the invention to provide a means to increase the integrated circuit chip density of a printed circuit board.

These and other objects of this invention will be better understood and become more apparent with reference to the subsequent detailed description considered in conjunction with the accompanying drawings.

DETAILED DESCRIPTION OF THE INVENTION

Generally speaking, the invention features a method and article of manufacture of this method, wherein a conventional printed circuit board can be modified to increase its integrated circuit chip density or capacity, while essentially using the same printed circuitry and pin-hole connections.

Figure 1:
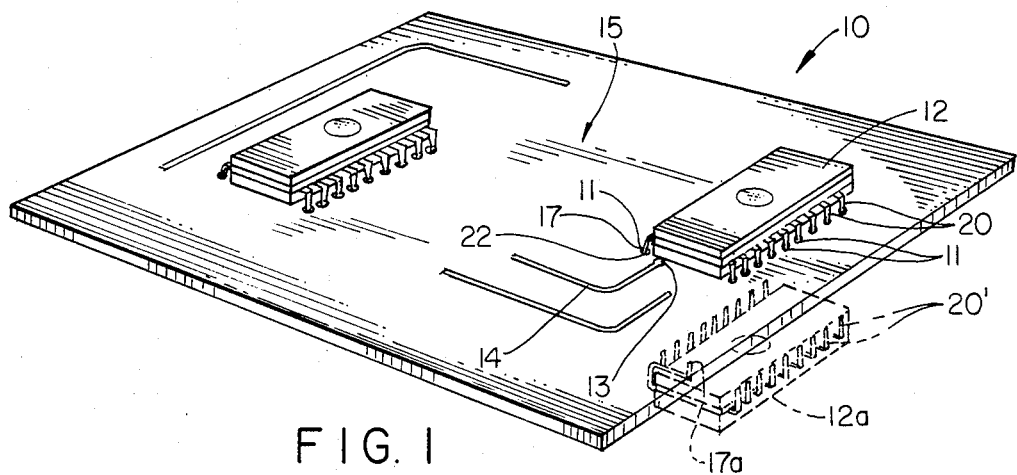
FIG. 1 is a perspective view of a printed circuit board being modified with an additional select lead connection in accordance with the invention.

Now referring to FIG. 1, a conventional printed circuit board 10 is shown. This printed circuit board 10 is modified according to this invention by selecting the pin-holes 11 of at least one integrated circuit chip 12 (typical) to be widened if necessary to accommodate the pins 20 of chip 12 and pins 20' of chip 12a.

In addition to the widened holes 11, an additional printed circuit line 14 and pin hole 13 are added to the printed circuit 15 disposed on top of the board 10. For purpose of definition, the additional circuitry line 14 and pin hole 13, will be referred to hereinafter as a "select lead connection", or a "select lead".

The purpose of the additional select lead is to provide the printed circuit board 10 with the capability of accommodating the additional chip 12a; i.e. chip 12 and chip 12a are enabled from different select lead connections, and are thus electronically and functionally independent of each other.

The chip 12 and the chip 12a fit the same pin holes 11, and are connected thereto in the same sequence, as will be explained, hereinafter.

Figure 4:
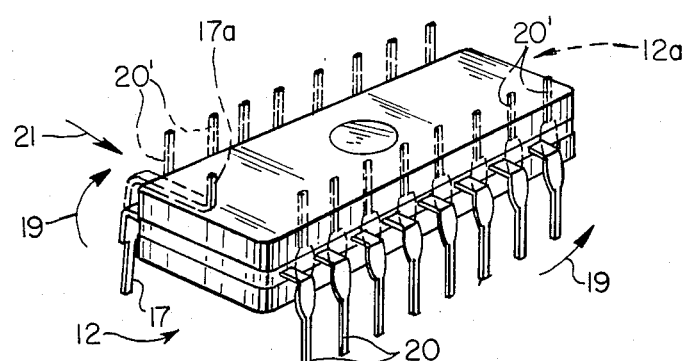
FIG. 4 illustrates a perspective view of an integrated circuit chip depiction in solid the standard pin arrangement and in phantom the modified pin structure for the circuit board of FIG. 1.

Referring to FIG. 4, the conventional integrated circuit chip 12 of FIG. 1, is modified to become the chip 12a. Chips 12 and 12a are electrically and functionally the same, but their pins 20 and 20' are respectively disposed in opposite directions, i.e. 180 degrees apart. The purpose of the opposite direction of the pins 20 and 20' is so that chip 12a can be placed under the printed circuit board 10 as illustrated in FIG. 1, and be accommodated by the same set of pin holes 11 that receive the pins 20 of chip 12 on top of the printed circuit board 10.

FIG. 4 illustrates how the pins 20 of chip 12 can be modified to become pins 20', thus converting chip 12 to chip 12a.

Pins 20 are bent upwardly (arrows 19) so that they face in the opposite direction and thus become pins 20'. In addition to the upward bending (arrows 19) of pins 20, the select pin 17 of chip 12 is additionally bent inwardly (arrow 21) to form a new select pin 17a.

Figure 3:
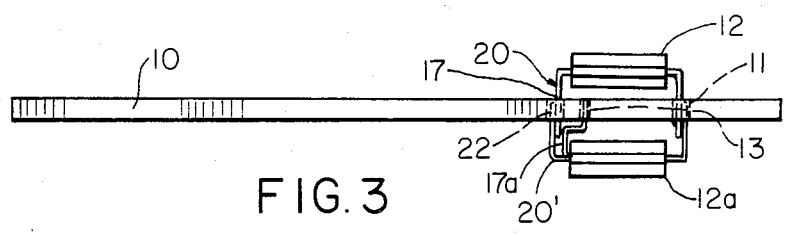
FIG. 3 is a side view of the printed circuit board of FIG. 1, depicting the integrated circuit chips assembled upon the printed circuit board.

Chip 12 has now been modified to chip 12a. Pins 20' fit the same set of pin holes 11 as chip 12, when chip 12a is inserted from beneath the printed circuit board 10 as shown in more detail in FIGS. 2 and 3.

Figure 2:
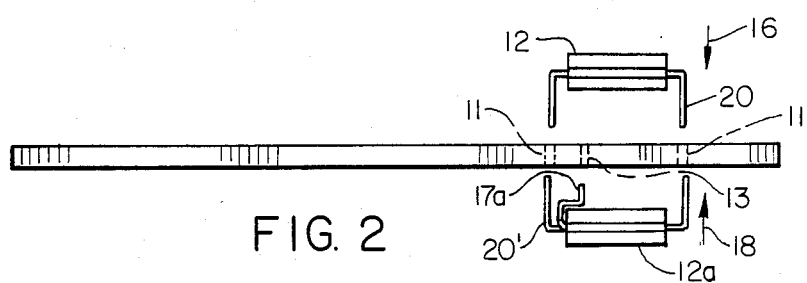
FIG. 2 is a side view of the printed circuit board of FIG. 1, illustrating the placement of integrated circuit chips into the board.

Chip 12 is inserted (arrow 16) into the set of pin-holes 11 from the top of the printed circuit board 10, as shown in FIG. 2, while the chip 12a is inserted (arrow 18) into the same set of pin holes 11 from beneath the board 10. All the same pin holes 11 are used except for the select lead hole 13.

The same sequence of the pin hole connections is accomplished for both chips when the pins 20' are inserted into the same set of pin holes 11 as the pins 20.

The chip 12 is connected to all the original pin holes 11 of the sequence including the original select lead pin 17 to the original select lead connection 22 (see FIG. 1). Chip 12a, however, does not get connected to the original select lead connection 22, but rather has its select lead pin 17a connected to the new select lead pin hole 13, as shown in the assembled state in FIG. 3.

Thus, both chips 12 and 12a, respectively, are assembled to essentially same pin holes 11 except for their respective select lead pins 17 and 17a.

Thus, both chips 12 and 12a operate from essentially the same printed circuit 15, and therefore, the integrated circuit capacity of the printed circuit board 10 is increased.

If all the chips are doubled, the chip density of the board 10 is doubled. In memory circuits, the doubling of the memory capacity is a decided advantage.

Many changes can be made to the connections and components depicted in the figures. The drawings are meant to provide only an exemplary teaching of how the invention can be practiced.

Having thus described the invention, what is meant to be protected by Letters Patent is presented by the subsequently appended claims.

What is claimed is:

1. A printed circuit board having first and second integrated circuit chips for each set of pin holes, in order to provide increased integrated circuit density, comprising:
   a printed circuit board having at least one set of pin holes for accommodating both first and second integrated circuit chips;
   a first select pin hole connection for receiving a select pin of said first integrated circuit chip; and
   a second select pin hole connection for receiving a select pin of said second integrated circuit chip.

2. The printed circuit board of claim 1, wherein said first and second integrated circuit chips are disposed essentially within the set of pin holes on opposite sides of said printed circuit board.

3. The printed circuit board of claim 2, wherein said first integrated circuit chip has pins disposed in an opposite direction to said pins of said second integrated circuit chip.

4. A method of increasing the integrated circuit density of a printed circuit board, comprising the steps of:
   (a) connecting a first integrated circuit to a set of pin holes including a first select lead connection disposed upon a printed circuit board;
   (b) providing an extra pin-hole connection for receipt of an additional select lead for accommodating a second integrated circuit; and
   (c) connecting a second integrated circuit in same sequence to said set of pin-holes disposed in the printed circuit board for said first integrated circuit except for said first select lead connection, said second integrated circuit being connected to said additional select lead to distinguish between the first and second integrated circuits, whereby said printed circuit board has increased integrated circuit density for essentially the same set of pin-holes.

5. The method of claim 1, wherein said first and second integrated circuits are connected on opposite sides of the printed circuit board.

6. The method of claim 5, comprising the step of:
   (d) bending pins of said second integrated circuit upwardly for placement into said printed circuit board beneath said first integrated circuit.

7. A method of increasing integrated circuit density upon a printed circuit board, comprising the steps of:
   (a) Fabricating a circuit board wherein at least one set of pin holes can accommodate two integrated circuit chips, each hole of said set except for a first select lead connection receiving a set of pins in same sequence from both first and second integrated circuit chips, each disposed on opposite sides of said printed circuit board;
   (b) providing said printed circuit board with a second select lead connection to distinguish between said first and second integrated circuit chips;

(c) connecting said first integrated circuit chip to said pin hole set including said first select lead connection; and (d) connecting said second integrated circuit chip to said pin hole set minus the first select lead connection and including said second select lead connection.

8. The method of claim 7, wherein said set of pins of said second integrated circuit chip are disposed in an opposite direction to that of said first integrated circuit chip, whereby said first and second integrated circuit chips are disposed in essentially the same pin hole set but on opposite sides of said printed circuit board.

* * * * *